(12) United States Patent
Herron

(10) Patent No.: US 6,690,168 B1
(45) Date of Patent: Feb. 10, 2004

(54) BIOMAGNETIC DETECTING AND IMAGING DEVICE

(76) Inventor: Allen Ray Herron, 3076 Pine Meadow La., Oakhurst, CA (US) 94644

( * ) Notice: Subject to any disclaimer, the term of this patent is extended or adjusted under 35 U.S.C. 154(b) by 0 days.

(21) Appl. No.: 09/914,095

(22) PCT Filed: Feb. 18, 2000

(86) PCT No.: PCT/US00/04190
§ 371 (c)(1),
(2), (4) Date: Aug. 20, 2001

(87) PCT Pub. No.: WO00/50911
PCT Pub. Date: Aug. 31, 2000

Related U.S. Application Data
(60) Provisional application No. 60/103,302, filed on Feb. 22, 1999.

(51) Int. Cl.[7] ............................................. G01V 3/00
(52) U.S. Cl. .................................. 324/318; 324/322
(58) Field of Search ................................ 324/318, 319, 324/322, 307, 309, 304; 128/653; 335/306

(56) References Cited

U.S. PATENT DOCUMENTS

| | | | | |
|---|---|---|---|---|
| 4,969,469 A | * | 11/1990 | Mills | 128/653 |
| 5,443,791 A | * | 8/1995 | Cathcart et al. | 21/1 |
| 5,891,031 A | * | 4/1999 | Ohyu | 600/409 |

OTHER PUBLICATIONS

S. Gider et al Classical and Quantum Magnetic Phenomena in Natural and Artifical Ferritin Proteins, Science Vol 268 Apr. 7, 1995, pp77–80.*

* cited by examiner

Primary Examiner—Diego Gutierrez
Assistant Examiner—Brij B. Shrivastav
(74) Attorney, Agent, or Firm—Marvin H. Kleinberg; Marshall A. Lerner; Kleinebrg & Lerner, LLP.

(57) ABSTRACT

There is disclosed a method and apparatus for sensing and generating images of objects including first sensor probe means sensitive to Coriolis forces for detecting first magnetic phenomena and for generating first signals in response thereto, second sensor probe means sensitive to Lorentz forces for detecting second magnetic phenomena and for generating second signals in response thereto and data processing means coupled to receive said first and second signals for analyzing said signals, correlating said signals and for deriving useful information from said signals. The method includes the steps of scanning an object with specially configured sensor probes for separating commingled magnetic fields into their spin two quadrupole tensor field energies, scanning the object with specially configured sensor probes for separating commingled magnetic fields into their spin one dipole vector field energies, detecting the separated field energies, processing the detected field energies to isolate signals representative of unique properties of the object and displaying a presentation that corresponds to and is representative of the unique properties detected by the scan.

33 Claims, 3 Drawing Sheets

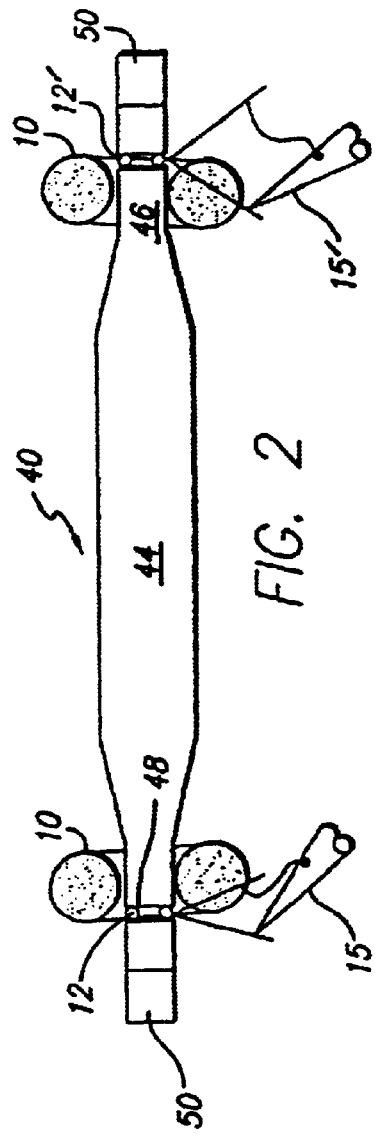
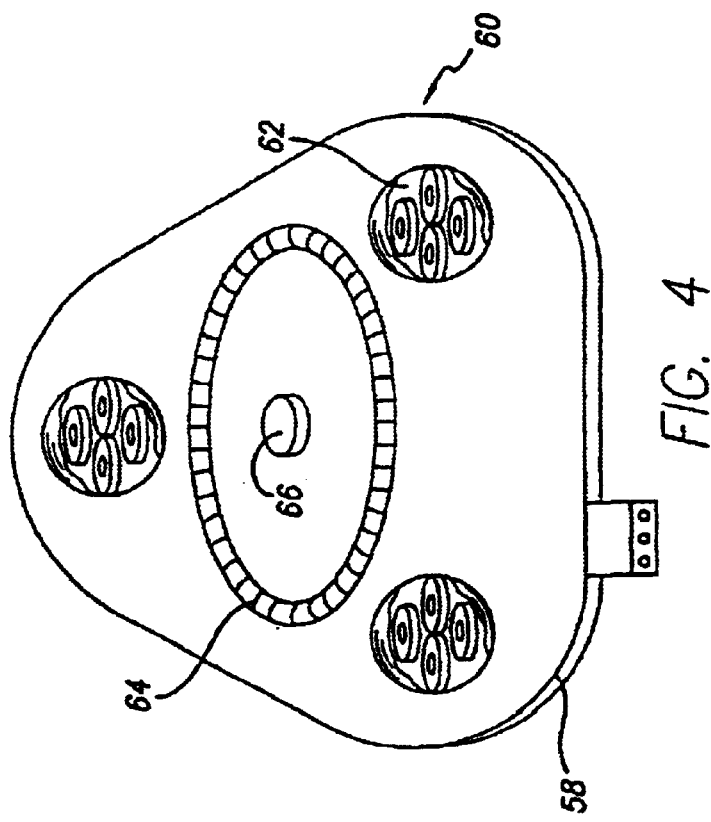
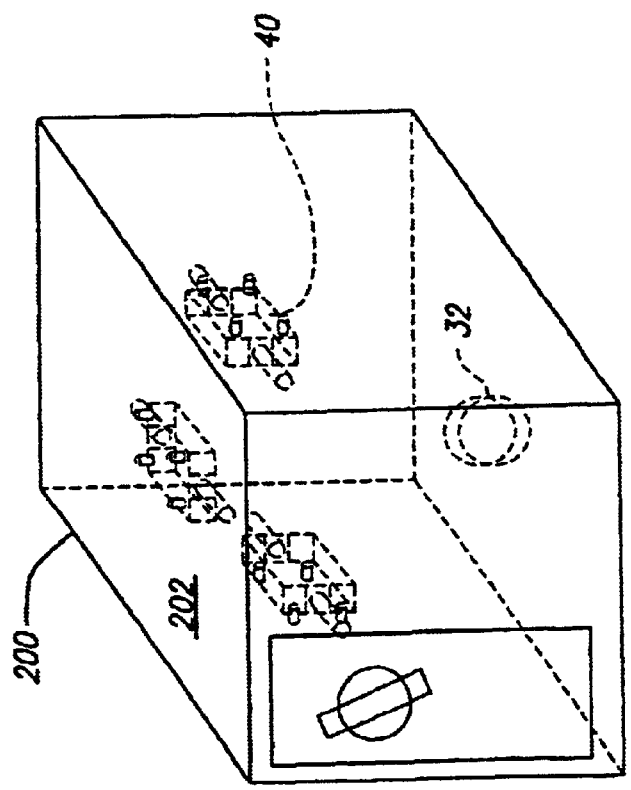

BIOMAGNETIC DETECTING AND IMAGING DEVICE

This is a continuation-in-part of my provisional application for patent, Ser. No. 60/103,302 filed Feb. 22, 1999.

BACKGROUND OF THE INVENTION

1. Field of the Invention

The present invention relates to signal detection and more particularly to apparatus for detecting and imaging bodies.

2. Description of the Related Art

Biomagnetic detection imaging to date has been limited to Magnetic Resonance Imaging devices ("MRI's") and Nuclear Magnetic Resonance devices ("NMR's") and ultrasound. When using MRI and NMR, the subject matter must be magnetized prior to any detection when using MRI or NMR devices. When magnetized, the subject body will have at least some of its spin vectors in a predominant direction. When the magnet is turned off and the spin vectors return to their normal position, they "wobble" and it is then that they can induce a voltage in a sensor. The wobble is called "magnetic precession". Ultrasound vibrates the molecules and records the reflected waves as an image.

MRI and NMR devices use a coil of wire as a sensor or a probe which exhibits a voltage when passing over or by the polarized source. Another important concept recognizes that the spin vectors in the body are predominantly up and down. One needs to keep in mind that an unmagnetized subject matter or body still induces a voltage in a moving coil but the signals are diametrically opposed and cancel each other.

The electromagnetic spectrum is a "spin one, dipole vector field" which couples the sensor coil to the subject matter. It has been found that there is also a "quadrupole tensor field" that permeates the universe. Nuclear quadrupole resonance ("NQR") is used in NMR in association with matter having a crystalline structure. The tensors are individual energy zones, instead of crystals; these nest one inside the other. In a vector field the dipoles are said to be either "up" or "down" and have fixed spin directions of "left" or "right". This relationship is customarily described as the "left" or "right-hand rule". The thumb points to the direction of movement of the dipole vector and the fingers point to the direction of spin or current flow.

With a quadrupole field, the left and right-hand spins are independent of the dipole vectors and exist as the four factors: spin up, down, left or right, which enable a quadrupole field to assimilate the information of a dipole vector field as separate pieces of information. In other words, up, left or right will produce two signals; down, right or left will produce two additional signals. They do not cancel each other out. With a dipole sensor producing one volt, a similar quadrupole sensor will produce four volts.

It has been observed that placing a Lorentz or Coriolis quadrupole probe in a magnetic field will facilitate the separation of the dipoles as they exist within the quadrupoles. The north and south sensors, as individual poles in the dipole vector, will receive different information. The important fact or result is that the information from the subject matter or body is now sensed without the requirement that it first be magnetized. In other words, with an MRI, one magnetizes the body to produce a signal while with Biomagnetic Imaging ("BMI"), one magnetizes the Lorentz signals to help separate them and produce a more usable signal or not magnetize as a Coriolis signal and then separate them. The magnet facilitates, but is not necessary in the Lorentz and is ineffective in the Coriolis.

Ultrasound uses high energy sound waves, typically at 10 megahertz to vibrate bone and tissue. This is then reflected back to a sensor probe to produce an image.

Coriolis probes sense the spin two quadrupole sensor fields that vibrate the body naturally at 12 megahertz as a renormalized carrier wave. This signal can be triangulated with a probe to compose an image, as will be shown below.

An MRI device magnetizes the body to produce a signal in a coil. BMI can sense the information with or without the body being magnetized. When doing BMI Lorentz sensing, the north and south poles, with their respective probes, can be joined as a magnet with probes that is external to the subject matter and the sensing is then done on the periphery via the lines of flux. This system is good for both sensing and imaging. When the two fields with probes are separated and facing each other, the subject matter or body can be placed between the poles. Between the probes there is a void that is somewhat spherical and within this void no signal is produced. The north and south magnetic poles should be aligned reversed with the earth's magnetic poles for best results. When stronger external magnets are used the effects of the Earth's magnetic fields are diminished.

The demarcation between sensing and the event horizon of the void is sharply defined. The void is an area where north and south poles cannot be separated with this setup. The size of the void is proportional to the strength of the opposing magnetic fields. Moving or fluctuating the magnetic field will produce enhanced resolution at the event horizon of the void. Coriolis probes require no magnetic fields to enhance signal acquisition.

The purpose of a BMI as a bio magnetic detector ("BMD") is that it can function using the methods described bove. If a BMI is to be used for imaging, the sensitivity of the Lorentz signal can be enhanced by the strength of the magnetic field, which can be varied but with the Coriolis it is the proximity that determines signal strength. Varying the field means that the separation and/or sensitivity of the signal can be varied. This translates into the fact that varying the lines of flux can determine when and where a signal is sensed.

If the only purpose is detection without spatial resolution then one can compare frequency spectrums to determine the composition of the subject. In the case that an image needs to be produced, X, Y and Z axes need to be established. Each Lorentz axis should contain both north and south poles with their respective sensors. In one example, the probe is invariant and separate coils are not required. In place of the coils, laminated sheets of Nu-metal® (metals of high magnetic permeability) are used. Each axis can be incorporated into one pair of sensor laminated plates.

Note that there are seasonal variations when using coils. In the northern hemisphere, counterclockwise spins dominate from the winter solstice to the summer solstice while clockwise spins dominate from the summer solstice to the winter solstice. The effects of spin can best be renormalized with the use of the invariant probe of Nu-Metal® used in the above described example.

Again, varying the field of a magnet with fields that are interacting with the sensor coils or plates, will set up a gradient and this gradient can be used to establish a field of view but is not required. That field of view can be magnetic and/or computer generated and will be further divided into an orthogonal grid where each box of the grid can represent one pixel in the finished picture. The production of this image using gradients is similar to conventional MRI's.

One extremely important difference is that with an MRI the main magnet produces a polarization of the dipoles of the subject in a predominant direction. The gradient then tries to maintain the magnetic polarization while the sensors record the magnetic precession in between the gradient pulses. In the case of the BMI device, the gradient on the magnet near or incorporated within the sensors, is used to separate and strengthen the signal but is not required for either the Lorentz or Coriolis probes.

The signal is detected when a gradient exists or can be computer generated by comparing Fast Fourier Transforms ("FFTs") of the signals from the sensors. It is not necessary to magnetize the subject matter. The use of a very short sequence gradient means that the area confined to the wavelength for that particular section in the grid is very small. That signal, when received, can then be further broken down via phase relationships using FFTs of one axis versus the others. The increased resolution would be a vast improvement over existing technologies. There is a high probability that resolution can be enhanced to less than the diameter of the hydrogen atom.

A typical MRI device uses a main magnet field of one Tesla and the magnetic gradient of two kilowatts. In comparison, the BMI Lorentz device can use less than 0.01 Tesla at the subject matter and may or may not require a few watts as magnetic and electrical gradients, respectively. The fact that the person receives some magnetic energy by virtue of the proximity to the sensors is not a factor that increases or decreases the sensitivity of the sensor probes.

The BMI device can continually sense and make use of its increased signal during the gradient pulses with an electronic marker to delineate the start of a pixel. The increased sensitivity is because the sensors are the area that the gradient is targeted so more or less lines of flux pass through the sensor probes. MRI devices must intermittently sense the signal after the gradient pulse because the sensor would be saturated during both the gradient and/or main magnet pulses.

Another feature of the BMI device is the use of an "excitation coil". The purpose of the excitation coil is sixfold. First, it helps force electrons, since spin two quadrupole fields do not move proportionally to the signal. This tends to connect the dipole fields with their quadrupole counterparts.

Second, the quadrupole field is the opposite of a dipole field, and therefore the use of the excitation coil enhances quadrupole sensing while reducing ambient electromagnetic noises. The reduction is typically in the order of 35+ dbm without detrimental deterioration of the quadrupole's ability to sense.

Third, the excitation coil helps stabilize the signals. Fourth, pre-amps can be located in close proximity to sensing probes and any feedback is greatly attenuated by the fields set up by the excitation coil.

Fifth, careful selection of the excitation frequency can cause a Larmor condition of the bonding frequencies of hydrogen. This enhances the signal acquisition of the 100, 200 MHz or more bonds of hydrogen to be sensed by the probe.

Sixth, the excitation frequency will heterodyne with all other signals to cause the sum and the difference signals and those in turn cause other sum and the difference signals. Each successive sum and difference will have less amplitude. Some of these generated frequencies will set up Larmor conditions with frequencies in the subject being sensed so as to increase sensitivity. The excitation frequency should be made to spin upon its axes as phase shift modulation to more closely resemble the quadrupole fields.

A preferred embodiment would employ a small pre-amp at the sensor and a large pre-amp outside of an enclosure in which a subject is sensed. The probe, magnet and pre-amp may or may not operate under cryogenic conditions. However, it is believed that under cryogenic conditions, much more information could be acquired. If, in the example described above, the magnets used were superconducting magnets, the signal strength of the sensed signals would increase substantially and many signals that are presently too weak to be detected would be sensed. Further, it is anticipated that the signal from the pre-amp used to modulate signal will be transmitted via a fiber optic cable to reduce electromagnetic interference both in and out of the enclosure.

The human body may be considered a transmitter in that protons spin, up, down, left and right causing signals. BMI and BMD can receive signals corresponding to all of these four axes simultaneously and segregate them to produce a usable signal. With an MRI device, the gradient energy required is roughly two thousand watts of RF with a superconducting main magnet.

With the technology of the present invention, a gradient of a few watts is sufficient and helps to increase signal separation and RFI suppression, but is not required. The gradient can be used to determine frequency location along with FFTs that are produced in the body. The gradient is used to effect the sensors directly and are not required to have any affect on the body being sensed.

The most basic difference between the prior art and the technology of the present invention is that an MRI device must magnetize a body to acquire a signal while a BMI device magnetizes the signal to improve signal strength and resolution. A BMI device can be used as a non-imaging diagnostic tool such as for early cancer detection or other abnormalities.

SUMMARY OF THE INVENTION

According to the present invention, signals can be detected from virtually all matter using appropriate sensors operating in predetermined frequency ranges. An installation using both north and south poles would require one or two sensors and one or two excitation coils, preferably made to the same wavelength although it is possible to eliminate the excitation coils if the sensitivity of the receivers was sufficient. The signal should be spun upon its axis as phase shift modulation to facilitate the Larmor conditions of quadrupole fields. This is an improvement over conventional technologies that use horizontal or vertical Larmor signals.

A pick up sensor should conform to the proper sequencing of frequencies, as wavelengths, to generate a carrier frequency. The carrier is then modulated by external signal sources in four axes to generate signals in a bandwidth ranging from near DC to frequencies greater than two gigahertz (GHz). The carrier frequencies are naturally occurring and the realities change by a factor of 1,000, such as 1.08577 megahertz and 1.08577 GHz.

This sensitivity of Lorentz probes and overall response can be improved by placing a sensor in the flux path of a concentrated magnetic field. Coriolis probes operate on a normal carrier of 12 MHz. and require no magnetic field to enhance the signal. The sensor probe, in the case of a BMI or BMD device, is very small. It is measured in millimeters in diameter, rather than centimeters. This allows much greater resolution than the much larger MRI device receiving coils.

MRI devices use a limited number of frequencies with amplitude variations to make a "picture". A BMI device uses many frequencies and amplitudes to obtain a "picture" with superior resolution. The BMI device has the ability to determine the chemical, atomic and anatomical makeup of the signal source, as well as structures such as cancers. The extra information can best be delivered in a full color format instead of the shades of gray found in a typical MRI printout. Each color and pixel can have additional information about each print out to increase the information about the subject matter. Dipole vector fields operate in either a vertical or horizontal plane and their modulation is either/or amplitude or frequency modulation. Quadrupole fields have the added quality of picking up phase shift modulation that is naturally occurring as an additional source of information. BMI and MRI will pick up the three types of modulation.

An excitation coil, if placed around the core of a magnetic flux field or Coriolis probes, can enhance the signal reception and reduce the electromagnetic background noise as radio frequency interference suppression ("RFIS"), especially if phase shift modulation is used. The coil can also be used to create a gradient by itself or in conjunction with a varying electromagnet rather than relying on a permanent magnet alone to increase the lines of flux that pass through the sensor probes.

The coil operates best when the excitation frequencies are spun on their axes as phase shift-modulation.

To a small degree, this is similar to the use of RF coils in MRI devices, but with greatly increased bandwidth on the targeted frequencies. RF is used as Larmor frequency for a specific frequency. In the BMI device, RF in the excitation coil causes an increased response from frequencies ranging from DC to more than two GHz. The excitation coil should conform to all naturally occurring frequency geometry's for best results, the same as the pick up sensor.

To construct a unit with enough sensitivity to enable it to detect the signal down to the background noise found within quadrupole tensor fields, one needs a frequency response of the sensor probes to be from near DC to over 1.8 GHz. The sensor probe is the most vital part of BMI or BMD. This technology presupposes the existence of Lorentz and Coriolis forces in the quadrupole field.

The Lorentz forces are magnetic in nature but will not move electrons and the Coriolis forces will move electrons but are nonmagnetic. In the event that the forces are weak or distorted, the excitation coil will compensate. In order to view the electromagnetic spectrum, this alignment of the Lorentz and Coriolis forces or the substitution of the Coriolis by the excitation coil is helpful and is why the spinning of the excitation signal is important.

Each combination of Lorentz and Coriolis forces has its own particular frequencies, which can be termed "realities". When a reality is selected, one must to take into consideration all frequencies that are exhibited in that reality in descending order.

In a natural open environment, it has been found that 12 megahertz is a renormalization carrier of the frequencies found in that particular reality of the Coriolis. The Lorentz carrier allows a modulated signal at a frequency 12.8 megahertz and the cube root of 1.28 megahertz or GHz, or 1.08577 megahertz or GHz. This frequency is then modulated by the dipole vector field or by the phase shift modulation produced in quadrupole fields.

When looking at the modulation, particularly FM and phase shift modulation, of that particular carrier frequency, there will be a profusion of additional frequencies produced. With a quadrupole FM modulation, the amount of information on a single frequency is vastly superior to that of a dipole. The modulated frequencies will range from near direct current to over one GHz. The information will include such things as earth tremors, any energy conversion process or matter containing energy including sunspots, and literally thousands of other signals.

Limiting the sensor's input of non-informational sources is essential for simplifying the analysis of the signals produced. To facilitate this goal, one may use the Coriolis probes in an open environment or may or may not use an enclosure made of one-inch aluminum plate constructed basically in the form of a two-meter cube for Lorentz probes. Some areas will require more or less amounts of shielding. A doorway with a two-inch internal flange, gasketed with radio frequency interference (RFI) tape was installed to ensure that the doorway suppressed RFI noises by at least 100 db.

A source of 120/220 volt sixty cycle A.C. is introduced into the enclosure through an RFI suppression filter of 125 db. In addition, any signal wires entering or exiting the enclosure must be shielded. That shield can be physically attached to the aluminum as it feeds through the wall.

Placing the probe inside the aluminum enclosure greatly suppresses RFI noise. Aluminum is used because it distorts the lines of flux from the person being sensed to a far lessor degree than steel. It appears that the Lorentz force passes through the enclosure apparently with little, if any, attenuation. The Coriolis force, on the other hand, is all but obliterated. This means that an excitation coil should be used to facilitate the coupling of the dipole to the quadrupole as in replacing the Coriolis to align it with the Lorentz.

Interestingly enough, it appears that inside the enclosure there exists a different reality. This reality has a cube root frequency of 1.08577 GHz or megahertz or multiples thereof that are divisible by 1,000. This is now the key frequency to which the probe must be manufactured to ensure compliance for the coupling of the dipole to the quadrupole. This means the carrier frequency will be 1.08577 GHz.

The wavelength of a signal with a frequency of 1.08577 GHz is 27.6 centimeters. The Coriolis force is non magnetic and moves electrons while the information mainly resides in the Lorentz force which is magnetic. The two produce an electromagnetic force.

The shape of the probe is a function of the length of the wire used as an antenna. In one experiment for the Lorentz, 27.6 centimeters (to correspond to the wavelength of 1.08577 GHz) of 30-gauge, gold-plated, enameled wire was used to construct the probe. This wire, after being properly configured, was placed in series with a resonating variable capacitor of 1–10 picofarads.

The wire was shortened to compensate for the length of the conductor in the capacitor. The looped wire will pick up more signal if it is spun or twisted continually with approximately 70 turns with an I.D. of 0.038 inches and an O.D. of 0.058 inches. Two coils should be made, one coil being wound with counterclockwise turns and the other with clockwise turns. Each is placed in the respective magnetic pole that results in the best response.

There is an alternative construction that also works extremely well. That involves the use of 27.6 centimeters of 40-gauge, Litz wire, which consists of 175 individually enameled wires which are twisted one turn to the inch and over coated, as a group, with nylon. The Litz wire is laid in concentric circles with an outside diameter of 0.750 inches. The coil is sandwiched between two pieces of electrical tape. The factory places a counterclockwise twist of one turn per inch and can be used in the counterclockwise coil without modification. The clockwise coil is made by unwrapping the Litz wire and reversing the twists to one clockwise turn per inch.

When these coils are individually put into the flux fields of north and south magnets, they will determine the dominant spin that is received on that particular pole. Each coil is shortened by the length of the resonating capacitor which is connected in series with the coil, usually of a capacitance of from 1–10 picofarads and adjusted to cause resonance.

The use of plates instead of coils removes the requirement of the coil's winding direction, resonating capacitors and the use of special signal pickup probes. The plates are laminated pieces of sheet metal "Nu Metal®" with an accumulated thickness of approximately 0.276 cm and a circumference of 27.56 cm on both plates and magnets. The circular plates are invariant to the spin of the energy. Note that the plates are centrally located to preserve the invariance and sandwiched between a 2.76 Neodymium magnet, where the plates are electrically separated from the magnets. There are other magnets placed to the left and right of the "sandwich" so the overall length is 27.65 cm. The entire magnetic assembly is wrapped by an excitation coil.

It is important to try each sensor coil as a probe in both north and south magnetic fields to ensure that each is producing the maximum amount of output. It is acknowledged that the size of the coils could vary and still work well. Larger coils mean more space is required for the coil to be inserted into the flux field. Doubling the thickness of the coil will reduce the lines of flux by a factor of four. This reduction is proportional to the signal loss, which can be made up by using four times as many wires. Larger, stronger magnets can be used with larger coils to enhance signal acquisition.

If more than one Litz wire is used for a coil, for example 12 Litz wires of 175 strands each, the inter-wire capacitance is in excess of the capacitance required for resonance. Therefore, it is necessary to omit the capacitor and add pig-tails and resonate to two wave lengths.

At a frequency of one GHz, the capacitance to resonate the coil is extremely small, bordering on the limits of current technology, which for a frequency of a GHz and up usually incorporates waveguides with down converters. The problem is that the information must be extracted using this resonant loop. Using a Tektronix® 6204 field effect, 10× reduction probe, which is connected across the resonating capacitor which, in turn, is in series with the sensor coil, allows resonance to be maintained. In the preferred embodiment, invariant plates with low impedance and high capacitance are employed so the use of the 6204 probe is not required.

The output of the probe is connected to a Hewlett Packard® 8447 pre-amp outside of the enclosure or other similar very low noise pre-amps. The sensor's output exits through the wall via shielded cable to the electronics outside the enclosure. This would be true for all three axes. In the case that each axis has both north and south poles, each is put through its own shielded pre-amp before tying the outputs together to exit the enclosure.

It is assumed that conditions could be made favorable to allowing both outputs of the Tektronix®6204 probes to be tied together and use just one pre-amp. While this would result in a cost savings, it could cause a reduction in signal. The signals are fed into Tektronix® 3086 Real Time Spectrum Analyzers. These devices demodulate the A.M., F.M. and the phase shift modulations and then digitizes the demodulation's to produce FFTs that represent the information contained in the modulation. To reduce the adverse effects of the main excitation frequency from saturating the sensor-probe, a preselector may be used to decrease the bandwidth and attenuate the unwanted excitation frequency. The 3086 also is very sharply tuned to only the desired frequency and bandwidth.

The Coriolis force moves the electrons, but its ability is diminished inside the enclosure. To replace the Coriolis and to further reduce RFI noise, one or more excitation coils are used inside or outside of the enclosure. Each coil is made by using 27.6 centimeter lengths of wire (the same length as in the sensor coil) which are laid parallel and are connected at the ends. The wires are then looped into a circle with a circumference of 27.6 cm. and soldered to a resonating capacitor, which is sandwiched between the ends of the wires.

In this case each individual wire is actually a bundle (Litz wire) of 175 wires, individually enameled and wrapped with nylon. Each 175-wire group is twisted one turn per inch by the manufacturer and then may or may not be wrapped with nylon. Each group of 500 to 1,000 Litz (175 strands) wires will comprise one excitation coil. The choice of clockwise or counterclockwise turns will effect the efficiency.

In one experimental setup, a group of 600 Litz bundles were used. The bundles had their cross sectional areas reduced by wrapping electrical tape tightly around the cross section until the entire loop was wrapped. The result was two excitation coils. (300 bundles each) The resonating capacitor can be experimentally chosen between 2 and 50 picofarads. The signal input to the excitation coils is placed across this resonating capacitor.

The signal input to the excitation coils, which are connected in parallel, can vary but a frequency of 100.08577, 120 or 250.01 megahertz at 50 ohms output impedance from a signal generator works well. The output is adjusted to result in less than 10 watts from the signal generator's output going into the parallel excitation coils. Each excitation coil is placed in the same plane and centered around each pickup sensor coil. The output should be adjusted for optimum sensitivity.

The 120, 100.08577 or 250.01 megahertz frequencies may seem like strange values but they work well in the excitation coil to couple the sensor coil to the Lorentz and the dipole fields by simulating the Coriolis force. Each quadrupole reality may be made up of numerous frequencies but there are key frequencies that need to be present in order to satisfy the hierarchy of energy and frequency and may or may not be spun upon their axes in conjunction with A.M. or F.M. modulations. As mentioned earlier, 1.08577, 8.577, 100, 200, 300, 400 and so on including 1.08577 GHz, need to be represented in some form in order for proper coupling to exist.

The primary frequency is 1.08577 GHz. Numerous frequencies have been selected from combinations of these numbers and using empirical data, the frequencies of 100.08577, 120.0, 250.01, 100.04289 or 100.0214 megahertz appear to be the best suited frequencies for the experimental equipment and the goals that have been set.

Hydrogen atoms resonate at 100, 200, 300, 400 megahertz, and so on. To this is added 0.08577 megahertz to get a total of 100.08577 megahertz. To receive the 300 and 400 megahertz frequencies from a subject requires higher excitation frequencies. Remember that applying these frequencies causes approximately 35+ dbm attenuation of the electromagnetic spectrum while leaving the quadrupole enhanced, so long as the excitation force is not excessive.

Although the excitation coil has five functions, the bulk of the wire requirements are there for RFI suppression. Different frequencies and/or wattage can be used. The makeup of the excitation coil is also somewhat arbitrary considering certain design criteria. The surface area of the numerous wires is a key factor. Using many smaller gauge wires will increase surface area. One drawback is that the smaller wire has more resistance. On the other hand, more wires can be added without exceeding the same wattage input.

The novel features which are characteristic of the invention, both as to structure and method of operation thereof, together with further objects and advantages thereof, will be understood from the foregoing and following descriptions, considered in connection with the accompanying drawings, in which a preferred embodiment of the invention is illustrated by way of example. It is to be expressly understood, however, that the drawings are for the purpose of illustration and description only, and they are not intended as a definition of the limits of the invention.

BRIEF DESCRIPTION OF THE DRAWINGS

FIG. 2 is a perspective view of excitation coils, Lorentz sensor probes and apparatus for one axis;

FIG. 3 is an idealized view of an enclosure in which measurements may be taken according to the present invention;

FIG. 4 is a perspective view of three Coriolis sensor probes as three axes, plus excitation coil and reference coil.

DESCRIPTION OF THE PREFERRED EMBODIMENTS

Figure 1:
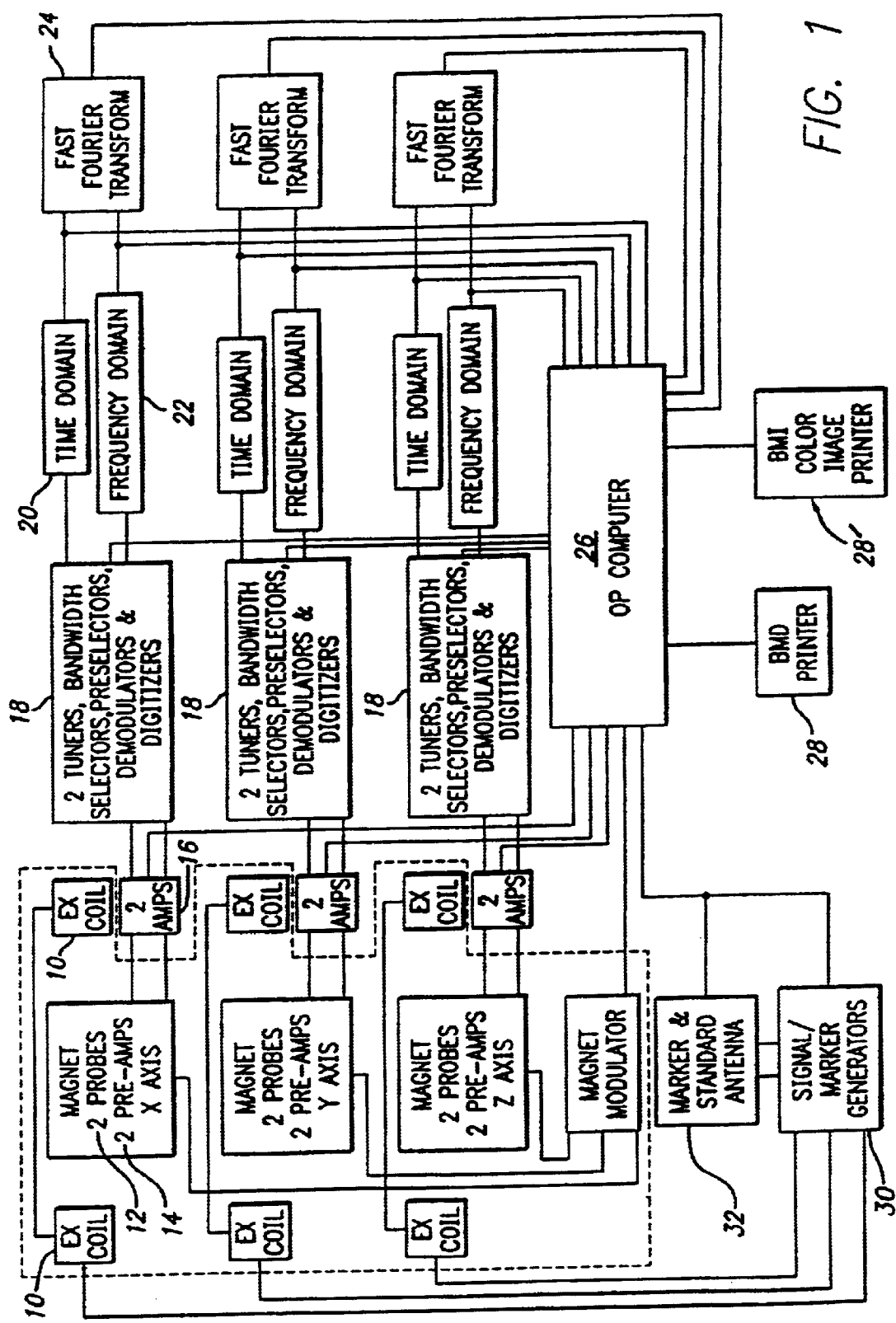
FIG. 1 is a block diagram of the circuits utilized in a preferred embodiment of the present invention.
Figure 5:
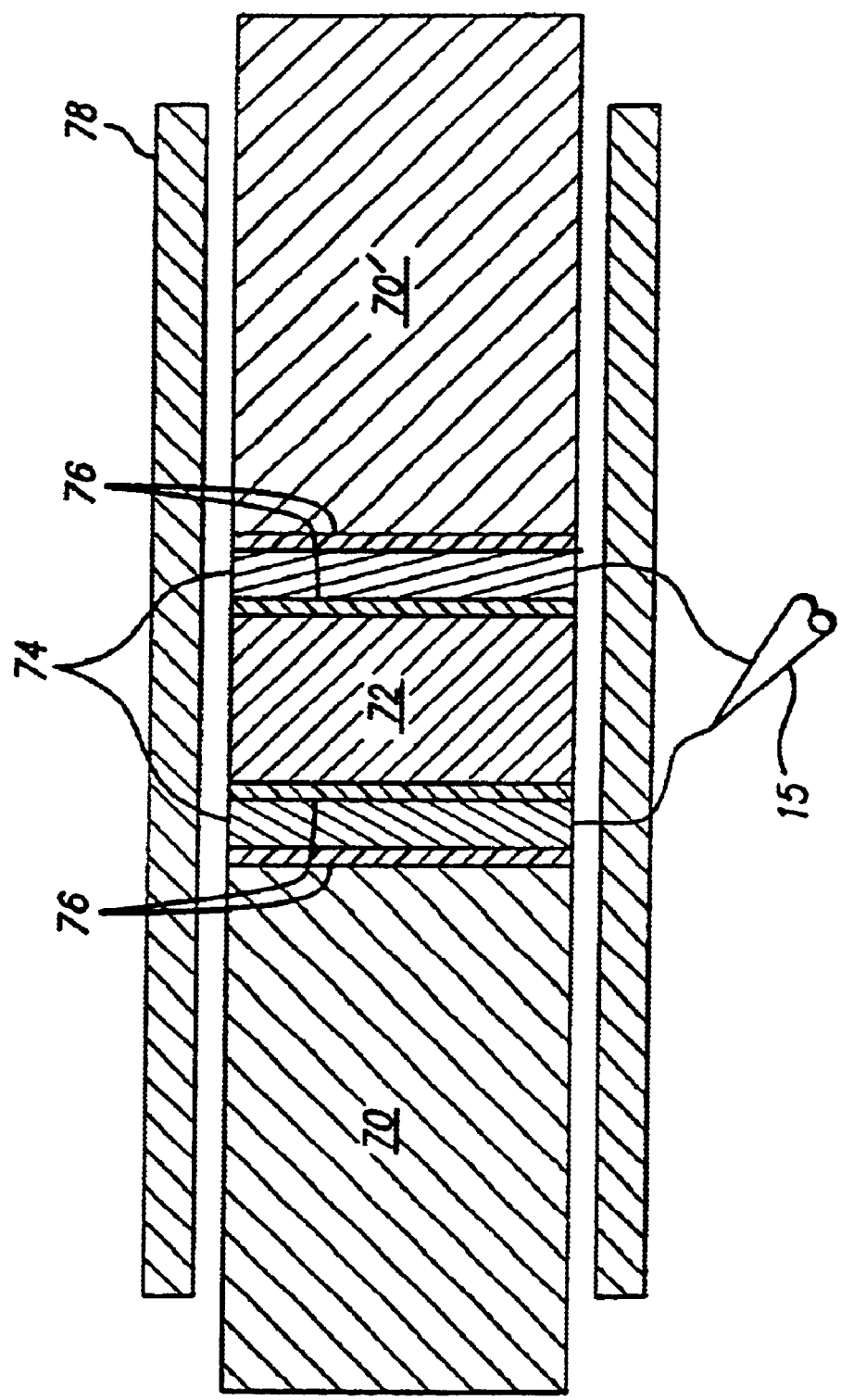
FIG. 5 is a view of the preferred embodiment sensor using round magnets and plates of Nu-metal®.

Biomagnetic detection ("BMD") could only require one channel if used for full body detection. The flow of information as laid out on the block diagram of FIG. 1 is essentially the same for BMD or biomagnetic imaging ("BMI"). BMI generates a picture, while the BMD is a printed report and could be done with one channel. A preferred probe is shown in FIG. 5, below.

What each of the thousands of signals means is vitally important with a BMD. Either the body or its subparts could be detected. Billions of pieces of information are received every second. To manage this information, it must be broken up into small manageable bites of about one picosecond duration. A bite of a few femtoseconds is technologically feasible. The bite will have a bandwidth of 50 KHz.

As can be seen from FIG. 1 in which three channels acquire information in each of the X, Y and Z axes, excitation coils 10 provide a background for the signal processing in each channel which flows from a probe 12 through a pre-amp 14, a power amplifier 16, into a tuner, frequency and bandwidth selector, preselector, demodulator and digitizer 18. A frequency and time domain converter with digital conversion 20, 22, feeds into a Fast Fourier Transformation ("FFT") device 24, a computer 26 and then finally to a BMD printer 28 and a BMI printer 28'. A real time spectrum analyzer marketed by Tektronix as the Tektronix® Model 3086 incorporates the demodulator, preselector, tuner, bandwidth selector and digitizers 18, the time domain 20 and frequency domain 22 elements as well as the FFT devices 24.

The preferred embodiment uses three Tektronix® 3086 Real Time Spectrum Analyzers that dp the job of selecting and limiting bandwidths, A.M., F.M. and phase shift modulation as well as time and frequency domains. The information is then Fast Fourier Transformed and stored as digitized strings of information, all controlled by the computer 26.

The key areas in the process are the domain converters 20, 22 with their digital outputs to the Fast Fourier Transformation device 24. The computer 26 receives the signals and processes them directly or can further extrapolate information through several, perhaps five, digital filters per octave in the computer (not shown) which are spaced one octave apart as one sequence of information as FFTs in a particular bandwidth. There may be thousands of frequencies and bandwidths that comprise all the information of one person's image.

The filters' digital output is assigned numbers by the computer 26, indicating how much of each filter's output is contained in that time period of perhaps a picosecond. The number sequence is like a license plate. After a period of so many thousand or million plates in a sequence, they will start to repeat themselves. This is very much like DNA strands. Each person has his particular code even though it is comprised of just percentages of five or more digital filters as a single sequence or as a bandwidth of many sequences. These procedures are done internally in the 3086 spectrum analyzer with a bandwidth of up to 3.0 GHZ. There are commonalties when comparing one person to another. The differences may be due to physiological dissimilarities or from disease processes.

By comparing one individual to a standard and then comparing deviations, one may be able to pinpoint a problem associated with a certain deviation. The comparisons would be done by the computer with its memory bank of standards and deviations known as a "Library".

It would be important to calibrate the unit prior to detection so the standard would have relevance. A standard could be produced with a signal generator that sweeps a range of frequencies with specific modulations. The unit's response to the standard signal could be adjusted so the computer could match that standard with that of its memory banks. Primary adjustments would come in the variations in the excitation frequency.

If a precise location is required, then all three axes (X, Y, and Z) are required. The process is then similar to the BMI but with a printed report, not a picture.

Biomagnetic imaging requires three axes to determine position. However, there must be some type of marker to indicate where in the field of view a pixel is to be placed. A change in the marker's timing will alter the segment that is used to start a particular field of view when that signal is referenced to the closest axis receiving a signal. Upon reception of the marker the information immediately following will start the field of view. The comparisons to the other two axes will be done through the comparisons in phase angles using FFT, can place an identity on the signal immediately following the marker or for a specific time period thereafter. It is acknowledged that physically moving the marker would facilitate ease in comparison of the phase angle.

The identity is broken up into small segments in the range of femto to picoseconds and with limited bandwidth per frequency. The time that the signal takes to reach the other two axes would be closely known. The FFTs of those two signals are compared bite for bite and sequence for sequence with the closest axis. When the three are congruent, this would be an indication of the exact time and place that the particular signal was produced. Each pixel may contain many numbers of transforms as multiple sequences containing multiple bites. To facilitate this, the three Tektronix® 3086 devices are synchronized together so as to act as one unit in real time.

The signal processing is very similar to that of a typical MRI with the exception of the addition of the phase shift modulation. One key difference is that a very large magnet is not required. The gradient is replaced by a marker generator 30, which may be enhanced through the use of gradient to cause more lines of flux to pass through the sensor probes. The gradient could be used to enhance signal acquisition but is not required. Varying the strength of the magnet and/or excitation signals could cause a line of flux to line up with a pixel that is being sensed.

Enhancing of the signal would give a better signal to noise ratio and help isolate the signal's location. The signal is acquired when the gradient is at maximum. With MRI's the signal is taken just after the gradient is turned off and the dipole exhibits precession. The difference is that, in a standard MRI, the signal in the body is manipulated while with BMI the signal is target of the manipulation.

The picture could be 256 or more colors and of higher resolution than current MRI technology. The computer can assign color coding to different types of tissue, or abnormalities such as diseased or cancerous tissues to help the doctor diagnose the patient when they are referenced to the "Library". Each color and location can be translated into thousands of pieces of information about that particular pixel and the reason for the color. Current MRI technology does a poor job of tissue recognition and/or recognition of abnormalities contained therein.

Turning next to FIG. 2, there is shown an experimental setup 40 which includes both the excitation coil 10 and the sensor as a coil 12. The shape of the coil 12 is a function of the length of the wire used as an antenna. In one Lorentz experiment, 27.6 centimeters of 30-gauge, gold-plated, enameled wire was used to construct the sensor coil 12. This wire, after being properly configured, was placed in series with a resonating variable capacitor of 1–10 picofarads.

As shown in FIG. 2, a large permanent magnet pile 40 is made up of a large neodymium plate magnet 44 that is 2½×2¾×18 inches and directs the magnetic flux through the tapered cone end 46 with a flat end 48. Several cylindrical neodymium magnets 50 that are ⅞ inches in diameter by 1 inch in thickness, (two in the illustrated example), are stacked on the end 48 of the cylinder sandwiching the sensor coil 12, over which is placed the moveable excitation coil 10. The magnets should produce, at the surface over which the sensor coil 12 is placed, a field of at least 5,000 gauss.

A similar configuration is found on the opposite end of the magnet 44, where an axially aligned conical termination 46' is found. A second excitation coil 10' and sensor coil 12' combination is placed on the conical termination 46' and a second group of cylindrical neodymium magnets 50' terminates the assembly. The Tektronix probe is indicated at 15, 15'.

Lorentz sensors such as are illustrated in FIG. 2 may use wire that is shortened to compensate for the length of the conductor in the capacitor. The looped wire will pick up more signal if it is spun or twisted continually with approximately 70 turns with an I.D. of 0.038 inches and an O.D. of 0.058 inches. Two coils should be made, one coil being wound with counterclockwise turns and the other with clockwise turns. Each is placed in the respective magnetic pole that results in the best response.

There are two alternative constructions that also work extremely well. These involve the use of 27.6 centimeters of 40-gauge, Litz wire. The Litz wire is laid in concentric circles with an outside diameter of 0.750 inches. The coil is sandwiched between two pieces of electrical tape. The factory places a counterclockwise twist of one turn per inch and can be used in the counterclockwise coil without modification. The clockwise coil is made by unwrapping the Litz wire and reversing the twists to one clockwise turn per inch.

When these coils are individually put into the flux fields of north and south magnets, they will determine the dominant spin that is received on that particular pole. Each coil is shortened by the length of the resonating capacitor which is connected in series with the coil, usually of a capacitance of from 1–10 picofarads.

The sensor coils work best when aligned with the earth's magnetic field. The neodymium magnet may be replaced with a superconducting version which may provide substantially more flux in the same volume.

With reference now to FIG. 3, there is shown a shielding enclosure 200 inside of which the excitation and sensing elements are located. A coil/probe combination 40 of FIG. 2 is provided for each axis. Each is mounted on an interior wall 202 of the enclosure 200 and each is spaced from the wall surface by an nonconductive spacer having a thickness of at least 27.6 cm. These coil/probes are indicated in dotted lines within the enclosure of FIG. 3.

The output of each of the sensor coils 12 is connected to a Hewlett Packard® 8447 pre-amp outside of the enclosure 200, or, if adequately shielded, inside the enclosure 200. The output is exited through a wall 202 of the enclosure 200 via a shielded cable to the electronics outside the enclosure 200. This would be true for all three axes. To avoid electronic interference, a fiber optic cable could be employed with the signals suitably modulated on a light beam carrier and a cryogenic pre-amp could be employed to amplify the signal.

In the preferred embodiment, the enclosure 200 is 12'× 12'×10' with the coil/probes 40 mounted on the walls and a computer controlled imaging table is placed in the center of the enclosure 200. A movable marker/standard coil 32 would be placed under the upper surface of the imaging table. In the case that each axis has both north and south poles and coil/probes, the output of each coil/probe 40 is put through its own pre-amp 14, which may or may not be fixed to the outputs to exit the enclosure 200.

FIG. 4 shows a board 58 upon which a Coriolis sensor that can be used outside the enclosure 200 is mounted. There are three equally spaced spheres 62 set into the board 58, each of which contains two sets of reverse wired coils 60 of 600 turns each or 2 Nu-Metal® plates of 27.65 cm in circumference and separated by 2.76 cm. The Coriolis sensor coil 60 is a wire coil, 45 gauge enameled copper wire, 600 turns on a bobbin 3.5 mm deep, 6.5 mm wide, 3.2 mm between flanges and a 3.2 mm spindle is required. It can be resonated by a 2–10 picofarad variable capacitor connected to a Tektronix® 6204 probe. There are 2 coils wired in series, reverse polarized and positioned upside down in relationship to each other and next to the other. There are two sets per axis. One set is wound counterclockwise and the other clockwise. Three sets comprise one setup as shown in FIG. 4. The larger ring 64 is an excitation coil while the smaller centered coil 66 is the marker/standard antenna.

The marker coil 66 is centered between the three sets of coils 60. The four coils 60 of each set are reverse polarized and are embedded in the rotatable sphere 62. Each sphere 62 is rotated so that the coils 60 are always oriented to be horizontal to the earth's surface. The same movements are required if using the plates of Nu-Metal®. Horizontal positioning ensures optimum signal. Deviations from the horizontal position cause signal degradation. The subject (which could be a human patient) should be in a horizontal position. A manual switch can be used to switch from clockwise to counterclockwise wound coils or they may be connected in parallel after the 6204 probes. The plates are invariant and do not require the switch.

The Coriolis sensors may or may not be used in the enclosure 200. Since it is non-magnetic, no additional magnetic fields are used. The sensor/probes operate at a frequency of 12 megahertz. The signal is very attenuated when put into the enclosure so additional application of the excitation frequencies is required to get a usable signal.

The board 58 which houses the Coriolis probe may be flat or concave with a handle on the opposite side for hand scanning of the subject body. There would be a visual display and the board 60 is used much in the same way as ultrasound, but is totally non-invasive with far greater resolution and the ability to identify different types of tissue or bone.

The structure of FIG. 5 may be considered a preferred embodiment of magnetic pile of FIG. 2. First and second neodymium magnets 70, 72 have a circumference of 27.65 cm. First magnet 70 is 12.12 , cm in length while second magnet 72 is 2.76 cm. in length. Laminated circular plates 74 are made of Nu-Metal® and function as a transducer instead of coils. Insulators 76 prevent electrical contact between the plate transducers 74 and the magnets 70, 72. The overall length of the structure of FIG. 5 is 27.65 cm. The magnetic pile can be wrapped by an excitation coil 78 and, as in FIG. 2, the output signals are detected by connection to a pick up probe 15 which is connected to the pre-amp.

Thus there has been shown a novel arrangement for detecting and imaging organisms and apparatus. However the scope of the invention should be limited only by the scope of the claims added below.

What is claimed is:

1. An apparatus for sensing and generating information from objects comprising:
   a. first magnetic field generating means including axially aligned magnets in intimate contact with ends that are adapted to receive a sensor probe element for generating information, with a magnetic field energy of at least 10,000,000 gauss-oersteds;
   b. second magnetic field generating means including at least two axially aligned magnets having a gap between them adapted to receive a sensor probe element, for generating information, enhanced by the concentrated magnetic field energy in excess of 10,000,000 gauss-oersteds;
   c. sensor probe means including a sensor probe element interposed in the direct axial flux path of said magnetic field generating means for detecting information bearing signals;
   d. excitation coil means surrounding said magnetic field generating means for enhancing the capability of said sensor probe elements within the contained magnetic field generated therein;
   e. excitation signal generating means connected to said excitation coil means for applying thereto a signal of predetermined frequency and amplitude;
   f. signal conditioning means coupled to said sensor probe means for selecting components of information bearing signals for analysis;
   g. signal processing means coupled to said signal conditioning means for extracting, from selected components of information bearing signals, significant data signals; and
   h. data processing means, coupled to receive said significant data signals for processing said signals to produce information displays representative of and corresponding to said significant data signals.

2. The apparatus of claim 1 wherein said first magnetic field generating means include a single magnetic element producing a flux of not less than 10,000,000 gauss oersteds.

3. The apparatus of claim 1 wherein said second magnetic field generating means include a plurality of secondary magnetic elements producing a flux of not less than 10,000 gauss oersteds.

4. The apparatus of claim 3 wherein said second plurality of magnets is axially aligned with said first magnetic field generating means and is axially separated therefrom with a gap between said first and second magnetic field separating means, said gap being adapted to receive sensor elements to detect information from subjects to be examined.

5. The apparatus of claim 3 wherein said second plurality of magnets is axially aligned with said first magnetic field generating means, the ends of which are adapted to receive sensor elements to detect information from subjects to be examined.

6. The apparatus of claim 1 wherein said first magnetic field generating means includes a single magnetic element of cylindrical shape having a first diameter, said cylindrical shape tapering to a second, smaller diameter and said second magnetic field generating means plurality of magnetic elements are generally of a cylindrical shape having a diameter approximately equal to said second diameter.

7. The apparatus of claim 1 wherein said excitation coil means include a plurality of turns of twisted wire of predetermined length, the ends of which are joined by a capacitive element to create a tuned circuit.

8. The apparatus of claim 7 wherein said capacitive element creates a circuit wherein the voltage and current components are 180° out of phase.

9. The apparatus of claim 7 wherein said twisted wire is single strand.

10. The apparatus of claim 7 wherein said twisted wire is multistrand.

11. The apparatus of claim 1 wherein said excitation coil means include capacitive means for modifying the phase relationships between applied current and voltage.

12. The apparatus of claim 11, wherein said capacitive means provides a phase relation of 180°.

13. The apparatus of claim 1, wherein said signal conditioning means includes means for excluding excitation signal frequencies.

14. The apparatus of claim 1, wherein said signal processing means includes means for processing harmonics and signals resulting from the heterodyning of signals from said excitation coil means and from the objects of interest.

15. The apparatus of claim 1, wherein said sensor probe element includes a filament having a length compatible with Lorentz wavelengths and integral multiples and fractions thereof, said filament being coiled in a clockwise direction.

16. The probe of claim 15 further including capacitive means across the ends of said filament to create a tank circuit.

17. The apparatus of claim 1, wherein said sensor probe element includes a filament having a length compatible with Lorentz wavelengths and integral multiples and fractions thereof, said filament being coiled in a counterclockwise direction.

18. The probe of claim 17, further including capacitive means across the ends of said filament to create a tank circuit.

19. The apparatus of claim 1, wherein said sensor probe element includes a first sensor probe component comprising a filament having a length compatible with Lorentz wavelengths and integral multiples and fractions thereof, said filament being coiled in a clockwise direction and a second sensor probe component comprising a filament having a length compatible with Lorentz wavelengths and integral multiples and fractions thereof coiled in a counterclockwise direction., said first and second sensor probe elements being arranged coaxially and connected serially to each other.

20. The apparatus of claim 19 above, wherein each of said sensor probe elements further includes capacitive means across the ends of said filament to create a tank circuit.

21. The apparatus of claim 1, wherein said sensor probe element includes a first sensor probe component comprising a filament having a length compatible with Coriolis wavelengths and integral multiples and fractions thereof, said filament being coiled in a clockwise direction and a second sensor probe component comprising a filament having a length compatible with Coriolis wavelengths and integral multiples and fractions thereof coiled in a counterclockwise direction, said first and second sensor probe elements being arranged coaxially and connected to each other in parallel.

22. The apparatus of claim 21, above, wherein each of said sensor probe elements further includes capacitive means across the ends of said filament to create a tank circuit.

23. The apparatus of claim 1, wherein said sensor probe element includes a sensor probe component comprising a filament having a length compatible with Coriolis wavelengths and integral multiples and fractions thereof, said filament being coiled in a clockwise direction.

24. The apparatus of claim 23, above, wherein said sensor probe component further includes capacitive means across the ends of said filament to create a tank circuit.

25. The apparatus of claim 1, wherein said sensor probe element includes a sensor probe component comprising a filament having a length compatible with Coriolis wavelengths and integral multiples and fractions thereof, said filament being coiled in a counterclockwise direction.

26. The sensor probe component of claim 25 above, further including capacitive means across the ends of said filament to create a tank circuit.

27. The apparatus of claim 1, wherein said sensor probe element includes a first sensor probe component comprising a filament having a length compatible with Coriolis wavelengths and integral multiples and fractions thereof, said filament being coiled in a clockwise direction and a second sensor probe component comprising a filament having a length compatible with Coriolis wavelengths and integral multiples and fractions thereof coiled in a counterclockwise direction, said first and second sensor probe components being arranged coaxially and connected serially to each other.

28. The apparatus of claim 27, above, wherein each of said sensor probe components further includes capacitive means across the ends of said filament to create a tank circuit.

29. The apparatus of claim 1, wherein said sensor probe element includes a first sensor probe component comprising a filament having a length compatible with Coriolis wavelengths and integral multiples and fractions thereof, said filament being coiled in a clockwise direction and a second sensor probe component comprising a filament having a length compatible with Coriolis wavelengths and integral multiples and fractions thereof coiled in a counterclockwise direction, said first and second sensor probe components being arranged coaxially and connected to each other in parallel.

30. The apparatus of claim 29, above, wherein each of said sensor probe components further includes capacitive means across the ends of said filament to create a tank circuit.

31. The apparatus of claim 1, wherein said sensor probe element includes a sensor probe component comprising a disc having a dimension compatible with Lorentz wavelengths and integral multiples and fractions thereof.

32. The apparatus of claim 1, wherein said sensor probe element includes a sensor probe component comprising a disk having a dimension compatible with Coriolis wavelengths and integral multiples and fractions thereof.

33. A method of deriving useful information from an object by the steps of:

a. scanning the object with specially configured sensor probes for separating commingled magnetic fields into their spin two quadrupole tensor field energies;

b. scanning the object with specially configured sensor probes for separating commingled magnetic fields into their spin one dipole vector field energies;

c. detecting the separated field energies:

d. processing the detected field energies to isolate signals representative of unique properties of the object; and e. displaying a presentation that corresponds to and is representative of the unique properties detected by the scan.

* * * * *